United States Patent [19]

Takeuchi et al.

[11] Patent Number: 5,479,373
[45] Date of Patent: Dec. 26, 1995

[54] SEMICONDUCTOR MEMORY DEVICE HAVING A PLURALITY OF BLOCKS

[75] Inventors: Hideki Takeuchi, Fujisawa; Shigeyuki Hayakawa, Chigasaki, both of Japan

[73] Assignee: Kabushiki Kaisha Toshiba, Kawasaki, Japan

[21] Appl. No.: 259,973

[22] Filed: Jun. 17, 1994

[30] Foreign Application Priority Data

Jun. 18, 1993 [JP] Japan .................................. 5-147666

[51] Int. Cl.[6] .............................. G11C 8/00; G11C 7/00
[52] U.S. Cl. ................. 365/230.03; 365/230.06; 365/154; 365/156; 365/190; 365/189.04
[58] Field of Search ..................... 365/230.03, 230.06, 365/238.05, 154, 156, 190, 189.04, 230.01

[56] References Cited

U.S. PATENT DOCUMENTS

| | | | |
|---|---|---|---|
| 5,285,414 | 2/1994 | Yamauchi et al. | 365/189.01 |
| 5,305,264 | 4/1994 | Takahashi | 365/190 |
| 5,357,479 | 10/1994 | Matsui | 365/230.06 |

*Primary Examiner*—David C. Nelms
*Assistant Examiner*—Huan Hoang

*Attorney, Agent, or Firm*—Foley & Lardner

[57] ABSTRACT

A semiconductor memory device comprises: a memory cell array having memory cells (1) arranged into a matrix pattern; a plurality of word lines (WL) each for selecting the memory cells arranged in the same line of the memory cell array; a plurality of bit lines (BL, NBL) each connected in common to the memory cells arranged in the same column of the memory cell array, for transmitting and receiving data to and from one of the memory cells selected by one of the word lines; a plurality of first column decoders (FCD) each for selectively connecting one of a predetermined number of the bit lines to one of a plurality of first common data lines (FDL, FNDL); a plurality of writing transistors (2) each provided for one of a plurality of the first common data lines and each having a data input line for inputting data applied from the outside thereto, the data inputted from the outside through the data input line being written in one of the selected memory cells so that data of a plurality of bits can be simultaneously written; a second column decoder (SCD) for selectively connecting one of the first common data lines to a second common data line; and a sense amplifier (4) connected to the second common data line, for reading data from the selected memory cell via the bit line, the first common data line and the second common data line, and for outputting the read data to the outside as one-bit data.

19 Claims, 4 Drawing Sheets

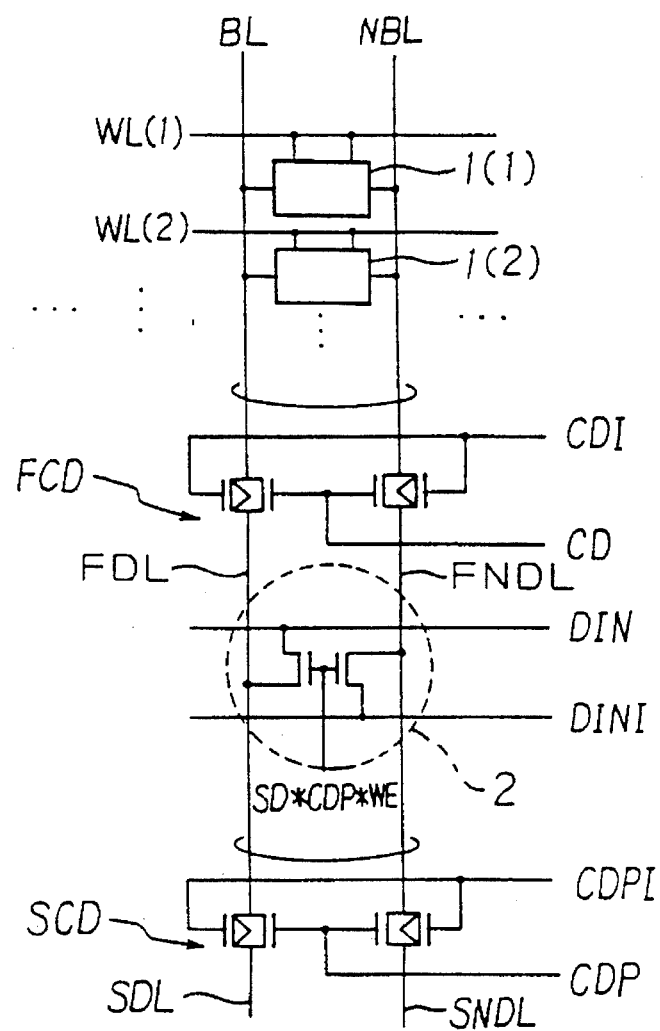
FIG. 1
FIG. 2 (A)
FIG. 2 (B)
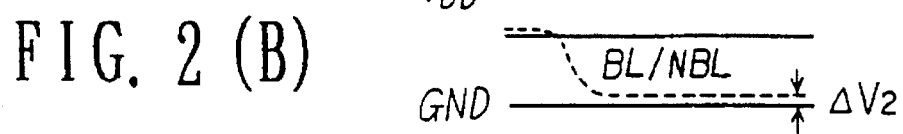

SEMICONDUCTOR MEMORY DEVICE HAVING A PLURALITY OF BLOCKS

FIELD OF THE INVENTION

The present invention relates to a semiconductor memory device, and more specifically to a semiconductor memory device of a random access type provided with hierarchical column decoders of more than two stages.

BACKGROUND OF THE INVENTION

In a random access memory (RAM) which can write and read data at random in and from a memory unit, a plurality of memory cells are arranged into a two-dimensional matrix pattern. Further, data given from the outside are written in the memory cells arranged at intersections between a selected word line and selected bit lines, or read out of the memory cells through sense amplifiers.

In more detail, when data are written in the memory cell, a word line is first selected on the basis of an address signal inputted from the outside, so that the memory cells connected to the word line are selected. Here, the data inputted from the outside are inputted to a pair of bit lines selected by a write circuit and through a common data line pair respectively, and then written in the memory cells.

On the other hand, when data are read, first a word line is selected on the basis of an address signal inputted from the outside, so that the memory cells connected to the word line are selected. After that, the selected memory cells output data stored therein to a pair of the bit lines, respectively. The data outputted to a pair of the bit lines are transmitted to a pair of common bit lines through a column decoder, amplified by sense amplifiers, and then outputted to the outside. Here, a 4-M SRAM will be described hereinbelow as an example of the conventional semiconductor memory devices. FIG. 3 shows a partial circuit diagram showing the same. As shown, a plurality of cells 1(1), 1(2), . . . for storing data are connected between a bit line pair composed of a bit line BL and a bit line NBL (an inversion signal line of the bit line BL). The cell 1 is of a static type memory cell as shown in FIG. 6, for instance. These memory cells are arranged into a matrix pattern so as to form a memory cell array. A plurality of the memory cells 1, 1, . . arranged in the same column of the memory cell array are connected between the same two bit lines BL and NBL, and a plurality of the memory cells 1, 1, . . . arranged in the same row are connected to any one of word lines WL(1), WL(2), . . . In an example shown in FIG. 3, only one bit line pair and only two word lines WL(1) and WL(2) are shown for brevity. Here, the cell 1(1) can be selected by the word line WL(1). To the bit line pair between which the cell 1(1) is connected, a first column decoder FCD and a second column decoder SCD are connected. A column decode signal CD and CDI (an inversion signal of the column decode signal CD) are given to the first column decoder FCD. Another column decode signal CDP and CDPI (an inversion signal of the column decode signal CDP) are given to the second column decoder SCD. Further, the bit line pair BL and NBL are connected to a data line pair (composed of common data line pair DL and NDL) via both the first column decoder FCD and the second column decoder SCD. Between the two common data line pairs DL and NDL, two write transistors 2 are connected. To the two write transistors 2, a data input line DIN and a data input line DINI (an inversion signal line of the data input line DIN) are connected.

In the semiconductor memory device shown in FIG. 3, the number of input/output bits is 8. Further, a double-word line selection method is adopted as the word line selection method, and 512 main word lines are arranged so as to be selected on the basis of addresses X1 to X9. Further, the memory cell array is divided into 32 sections, and each section is composed of 128 (16×8 bit) columns. As shown in FIG. 3, the columns are selected by the first and second column decoders FCD and SCD constructed hierarchically. In more detail, the first column decoder FCD is arranged in units of 4 columns, and the second column decoder SCD is also arranged in unit of 4 columns. Therefore, it is possible to select any one of the 16 columns on the basis of the column decode signals CD, CDI; and CDP, CDPI. As described above, since the columns can be selected hierarchically on the basis of the first and second column decoders FCD and SCD, there exists such an advantage that the number of column decode signals can be reduced so that the sense amplifiers can be arranged easily and further the pattern area can be reduced. For example, in the case of one-stage column decoders, 32 decode signals are necessary. In the case of two-stage column decoders, however, 16 decode signals are enough as far as 16 columns are selected hierarchically. In this case, since the gate capacitance connected to the column decode signal lines can be also reduced, the access time can be also increased.

Here, the operation of writing data in the cell 1(1) will be described hereinbelow. First, when the word line WL(1) is selected, the cell 1(1) connected to the selected word line WL(1) is selected. Further, one of the 16 columns is selected on the basis of the column decode signals CD and CDI applied to the first column decoder FCD and the column decode signals CDP and CDPI applied to the second column decoder SCD. A pair of data to be written which are formed according to the write data inputted from the outside and inputted to the data input lines DIN and DINI are at a high potential on one side and at a low potential on the other side, respectively, as shown in FIG. 4(A). Here, when a logical product of a section decode signal SD and a write signal WE is given, the two write transistors 2 are selected. On the basis of the data on the data input lines DIN and DINI, the selected write transistors 2 give the high potential and the low potential to the common data line pair DL and NDL, respectively. The data on the common data line pair DL and NDL are given to the bit line pair BL and. NBL via the first and second column decoders, respectively. Once the data are given to the bit line pair BL and NBL as described above, data is to be written to the cell 1(1) selected by the word line WL(1).

On the other hand, the data read process is quite the same as above. The cell 1(1) is selected; the bit line pair BL and NBL are selected; data is given to the common data line pair DL and NDL from the cell 1(1); and then the data is read out via sense amplifiers (not shown).

Here, when the data write operation is taken into account, the data on the data input lines DIN and DINI are transmitted to one of the bit lines BL and NBL via the two write transistors 2 and the turned-on column decoder FCD or SCD, and then given to the cell 1. In the conventional memory device, however, since there exist turn-on resistances of the write transistors 2 and the first or second column decoder FCD or SCD, the low-side potential of the bit line pair BL and NBL rises considerably high, as compared with the low-side potential of the data input line pair DIN and DINI. In other words, as shown in FIG. 4(B), the low-side potential of the data transmitted to the bit lines BL and NBL becomes higher by ΔVI than the low-side potential of the data given to the data input lines DIN and DINI.

Therefore, once the low potential of the bit line pair increases, since the cell 1 is not symmetrical with respect to the bit line pair due to the influence of the parasitic resistance thereof, there arises a problem in that data is not written in the cell properly and reliably.

As described above, in the conventional semiconductor memory device provided with the column decoders of more than two stages, since the low-side potential rises due to the turn-on resistance of the column decoder transistor, there exists a drawback in that the data cannot be written in the cell 1 properly, with the result that not only the access speed deteriorates but also the reliability is degraded.

In addition, in the conventional semiconductor memory device, since the number of bits (e.g., 8 bits) is the same on both the input (write) and output (read) sides, it is difficult to design such a semiconductor memory device that the number of input bits is different from that of the output bits (in particular when the number of input bits is larger than that of the output bits), so that the degree of design freedom is low when the access speed is required to be improved.

SUMMARY OF THE INVENTION

With these problems in mind, therefore, it is the primary object of the present invention to provide a semiconductor memory device high in operational speed and reliability and further in the degree of design freedom such that the number of writing bits can be increased in comparison with the number of reading bits.

To achieve the above-mentioned object, the present invention provides a semiconductor memory device, comprising: a semiconductor memory device provided with a predetermined number of memory cell blocks each for outputting one-bit data and for writing a predetermined number of bits of data simultaneously, each said memory cell block comprising: a memory cell array having memory cells arranged into a matrix pattern;

a predetermined number of word lines each for selecting the memory cells arranged in the same line of the memory cell array; a predetermined number of bit lines each connected in common to the memory cells arranged in the same column of said memory cell array, for transmitting and receiving data to and from one of the memory cells selected by one of the word lines; a predetermined number of first column decoders each for selectively connecting one of a predetermined number of the bit lines to one of a plurality of first common data lines; a predetermined number of writing means each provided for one of a predetermined number of the first common data lines and each having a data input line for inputting data applied from the outside thereto, the data inputted from the outside through the data input line being written in one of the predetermined number of selected memory cells so that data of the predetermined number of bits can be simultaneously written; a predetermined number of second column decoders for selectively connecting one of a predetermined number of the first common data lines to a second common data line; and a sense amplifier connected to the second common data line, for reading data from the selected memory cell via the bit line, the first common data line and the second common data line, and for outputting the read data to the outside as one-bit data

BRIEF DESCRIPTION OF THE DRAWINGS

FIG. 1 is a partial circuit diagram showing one column of an embodiment of the semiconductor memory device according to the present invention;

FIGS. 2(A) and 2(B) are waveform diagrams for assistance in explaining the operation of the semiconductor memory device shown in FIG. 1;

DETAILED DESCRIPTION OF THE EMBODIMENTS

The embodiments of the present invention will be described hereinbelow with reference to the attached drawings.

Figure 3:
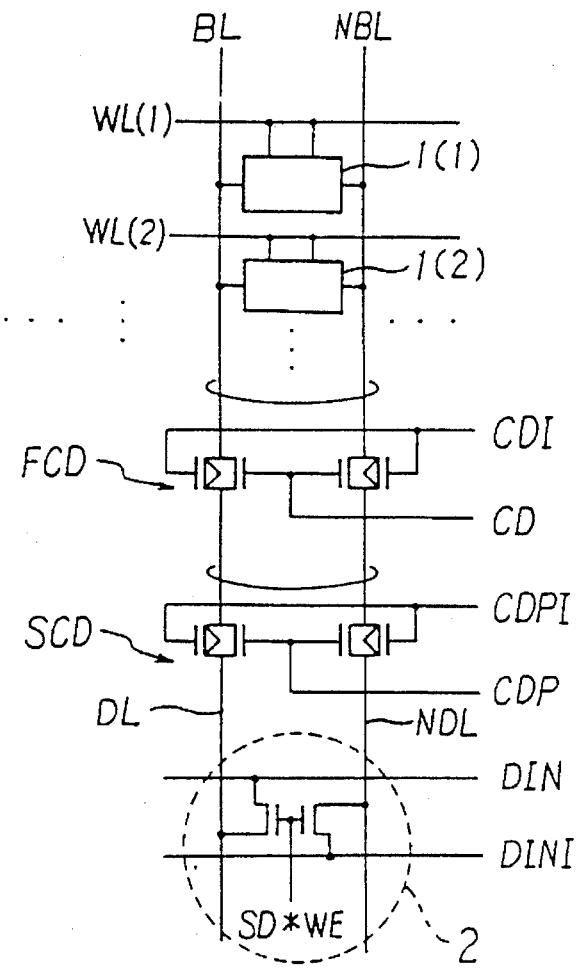
FIG. 3 is a partial circuit diagram showing a conventional semiconductor memory device.
Figure 6:
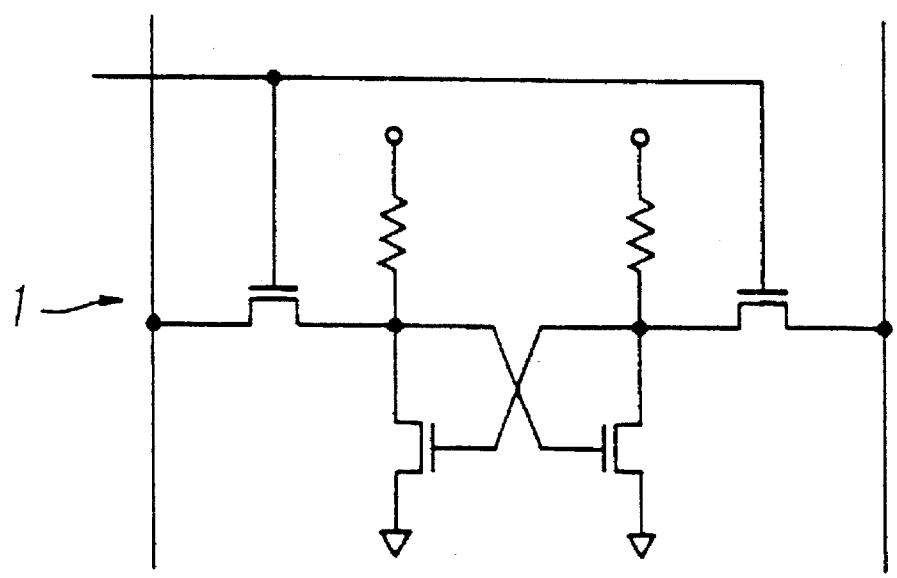
FIG. 6 is a circuit diagram showing an example of static-type memory cells.

FIG. 1 is a partial circuit diagram showing one column of an embodiment of the semiconductor memory device according to the present invention. As shown, a first column decoder FCD (to which column decode signals CD and CDI are inputted)is interposed between bit lines BL and NBL (between which the cells 1(1) and 1(2) are connected) and first common data line pair FDL and FNDL (between which the two write transistors 2 are connected). On the other hand, a second column decoder SCD (to which column decode signals CDP and CDPI are inputted) is connected to second common data line pair SDL and SNDL (which are connected to the first common data line pair FDL and FNDL, respectively). Further, a logical product of a section decoder signal SD, a column decode signal CDP and a write signal WE is applied to the write transistors 2. Further, although not shown, sense amplifiers for sensing and amplifying data of the cell 1 (as shown in FIG. 6) are connected to the second common data line pair SDL and SNDL, respectively. Further, in the same way as in FIG. 3, the first column decoder FCD for receiving the column decode signals CD and CDI selects the bit lines BL and NBL from 4 bit line pairs containing the bit lines BL and NBL. On the other hand, the second column decoder SCD for receiving the column decode signals CDP and CDPI selects the first common data line pair FDL and FNDL from 4 common data line pairs containing the first common data line pair FDL and FNDL. In this embodiment, although not shown in FIG. 1, the number of the write transistors 2 increases four times larger than that of the conventional circuit. However, since the numbers of column decode signals CD, CDI, CDP and CDPI and the numbers of the data input lines DIN and DINI are the same as those of the conventional circuit, it is possible to realize the circuit as shown in FIG. 1 in a layout pattern area roughly the same as with the case of the conventional memory device.

The operation of the memory circuit as described above will be described hereinbelow.

First, the data writing operation will be explained. When the word line WL(1) is selected, the cell 1(1) connected to the word line WL(1) is selected. Further, on the basis of the column decode signals CDP and CDPI given to the second column decoder SCD, the second common data line pair SDL and SNDL is selected and then connected to the first common data line pair FDL and FNDL, respectively. At this time, the write transistors 2 are turned on. Further, on the basis of the column decode signals CD and CDI given to the first column decoder FCD, the bit lines BL and NBL are connected to the first common data line pair FDL and FNDL, respectively. At this time point, the write transistors 2 are connected to the cell 1, and further the first common data line pair FDL and FNDL is set to a high-side potential and a low-side potential, respectively, on the basis of the data inputted from the outside to the data input lines DIN and DINI, so that the data inputted externally is written in the selected cell 1.

Figure 4:
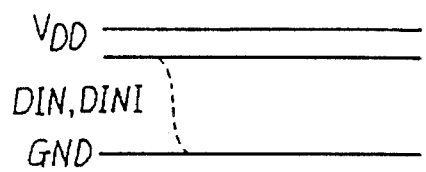
FIGS. 4(A) and 4(B) are waveform diagrams for assistance in explaining the operation of the conventional semiconductor memory device shown in FIG. 3.
Figure 4:
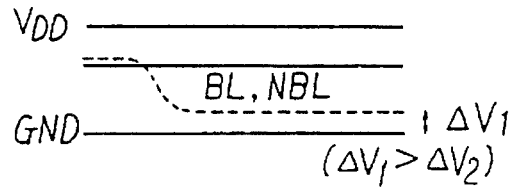

As a result of the operation as described above, since there exists only the first column decoder FCD responsive to the high-side potential and low-side potential of the data existing on the data input lines DIN and DINI in the data writing operation, as shown in FIG. 2(A), it is possible to suppress a rise of the low-side potential of the common data line pair DL and NDL due to the turn-on resistances of the write transistors 2 down to $\Delta V2$ ($<\Delta V1$), with the result that data can be written in the cell 1 securely. Further, as is well understood by the comparison between FIGS. 2(B) and 4(B), the rise $\Delta V2$ (invention) in the low-side potential is lower than the rise $\Delta V1$ (conventional) in the low-side potential to such an extent as to correspond to the absence of the second column decoder SCD.

Further, in the data read operation, the bit lines BL and NBL connected to the cell 1(1) are selected by the first column decoder FCD and further connected to the first common data line pair FDL and FNDL. Further, the first common data line pair FDL and FNDL is selected by the second column decoder SCD and further connected to the second common data line pair SDL and SNDL. By the above-mentioned connections, the cell 1Cl) is connected to the sense amplifiers (not shown) to read the data to the outside after amplification.

As described above, in the memory device according to the present invention, since a plurality of the column decoders are arranged separately and hierarchically in such a way that a single column decoder FCD is interposed between the cells 1 and the write transistors 2, it is possible to suppress a rise in the low-side potential of the write data, thus enabling a high speed and reliable data writing operation.

Figure 5:
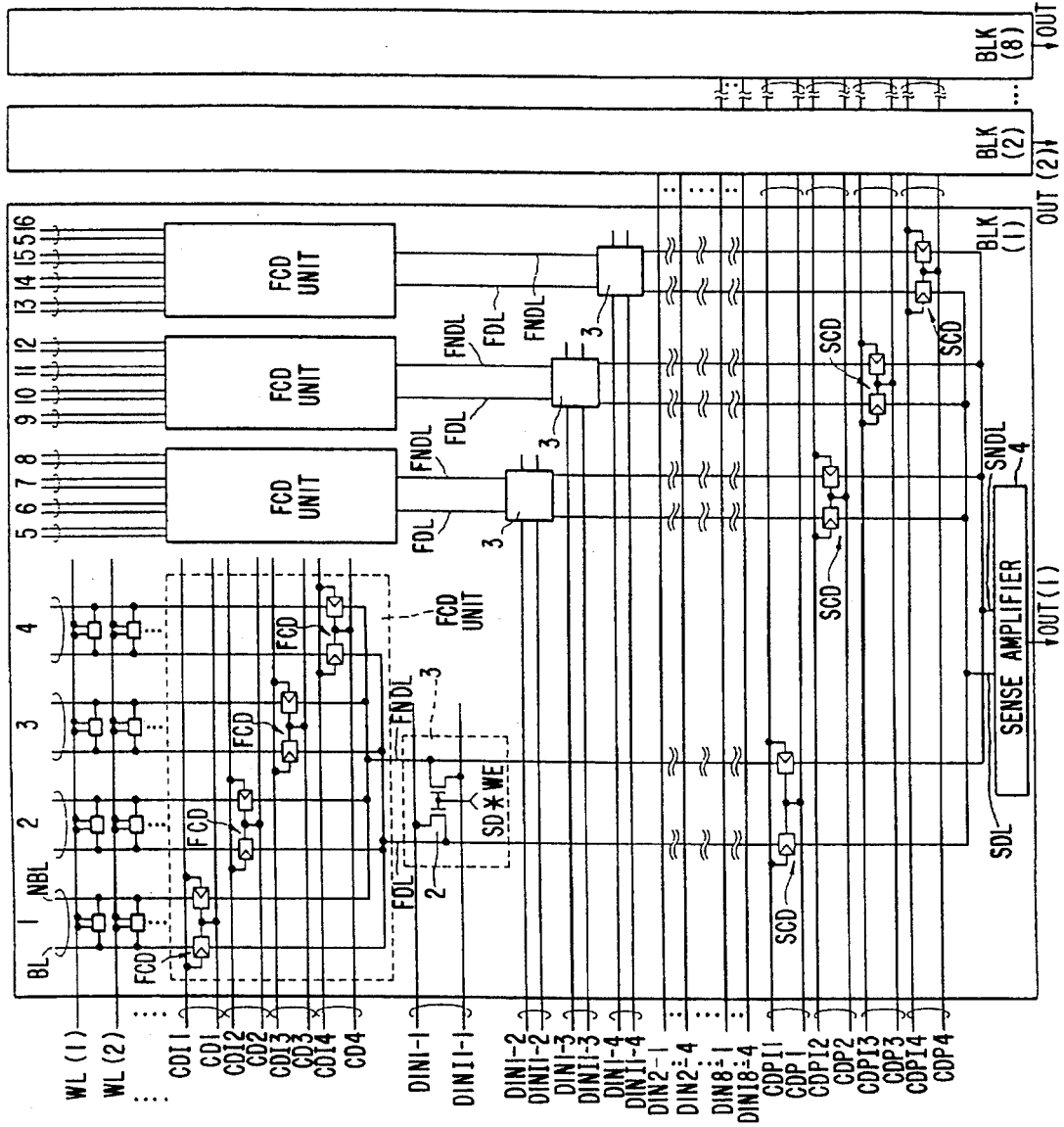
FIG. 5 is an overall circuit diagram showing the embodiment of the semiconductor memory device according to the present invention, in which the circuit shown in FIG. 1 is used.

FIG. 5 is an overall circuit diagram showing the embodiment (which uses the circuit shown in FIG. 1) of the semiconductor memory device according to the present invention. The device shown includes the same 8 blocks BLK(1) to BLK(8). From the standpoint of each block, 4-bit data can be written and 1-bit data can be read. Accordingly, from the standpoint of the overall section, 32-bit data can be written and 8-bit data can be read. In each block, as shown in FIG. 5, a plurality of memory cells 1 are connected between a bit line pair BL and NBL of a column. The memory cells can be selected by selecting word lines WL1, WL2, ... Further, a second common data line pair SDL and SNDL is connected to a sense amplifier 4. To the second common data line pair SDL and SNDL, 4-sets of the second column decoders SCD (selectively operative on the basis of the column decode signals CDP1, CDPI1, CDP2, CDPI2, ...) are connected, in order to connect any one set of the 4-sets of the first common data line pairs FDL and FNDL to the sense amplifiers 4 via the second common data line pair SDL and SNDL. To the respective first common data line pair FDL and FNDL, one set of complementary data transmitted from data input lines DINl-i and DINIl-i are inputted through two transistors 2 of a write circuit 3.

In other words, from the standpoint of the overall blocks, all different data input lines are connected to 32-sets of the write circuits 3, so that it is possible to write data in units of 32 bits.

The operation of the memory device shown in FIG. 5 will be described hereinbelow.

First, in the data write operation, one of the word lines WL(1), WL(2), ... is selected, so that the memory cells 1, 1, ... connected to the selected word line are selected. In this operation, all the write transistors 2 in the selected section are turned on in response to the signals SD*WE inputted to the write circuits 3. Further, on the basis of the column decode signals CD1, CDI1, CD2, CDI2, ... given to the first column decoders FCD, one of the bit line pairs connected to the first common data line pair FDL and FNDL is selected via the first column decoders FCD (for each block). Here, since the number of the first common data line pairs FDL and FNDL is 4, 4-units of the columns are eventually selected from 16-units of the columns. That is, 32(4×8)-units of the columns are selected in one section. In this case, when 32-bit data are inputted from the outside, the first common data line pair is set to a high potential and a low potential, respectively, on the basis of the inputted data, so that the data can be written in the selected memory cell. As described above, 32-bit data can be written in the memory cells simultaneously.

On the other hand, in the data read operation, one of the 4-bit line pairs BL and NBL is selected by the first column decoder FCD and connected to the first common data line pair FDL and FNDL. In the same way, one of the 4 first common data line pairs FDL and FNDL is selected by the second column decoder SCD and connected to the second common data line pair SDL and SNDL. Further, data written in the memory cells are amplified and read through the sense amplifiers 4 connected to the second common data line pair, with the result that it is possible to read 8-bit data simultaneously.

As described above, since 32-bit data can be written simultaneously, it is possible to increase the speed of data write operation, thus allowing a high speed access to the memory cells.

As described above, in the semiconductor memory cell according to the present invention, since the column decoders are arranged hierarchically in the memory cell array, there exists such an advantage that the data can be written securely, so that it is possible to increase the access speed and reliability. In addition, since the number of bits of the written data can be increased in comparison with the number of bits of the read data, there exists another effect such that the data access speed can be further increased.

What is claimed is:

1. A semiconductor memory device provided with a predetermined number of memory cell blocks each for outputting one-bit data from a selected memory cell and for writing a predetermined number of bits of data simultaneously to a predetermined number of selected memory cells, each of said memory cell blocks comprising:

a memory cell array having memory cells arranged in a matrix pattern of rows and columns;

a predetermined number of word lines each for selecting the memory cells arranged in a same row of said memory cell array;

a predetermined number of bit line pairs each connected in common to the memory cells arranged in a same column of said memory cell array, for transmitting and receiving data to and from one of the memory cells selected by one of said word lines;

a predetermined number of first column decoder units each for selectively connecting one of a predetermined number of said bit line pairs to one of a plurality of first common data line pairs;

a predetermined number of writing means each provided for one of a predetermined number of the first common data line pairs and each having a data input line pair for inputting data applied from the outside thereto, the data inputted from the outside through the data input line pair being written in one of said predetermined number of selected memory cells so that data of the predetermined number of bits can be simultaneously written;

a predetermined number of second column decoder units each for selectively connecting one of the predetermined number of the first common data line pairs to a second common data line pair; and a sense amplifier connected to the second common data line pair, for reading data from the selected memory cell via said one of the predetermined number of said bit line pairs, said one of the predetermined number of the first common data line pairs and the second common data line pair, and for outputting the read data to the outside as one-bit data.

2. The semiconductor memory device of claim 1, wherein the number of each of said predetermined number of the first common data line pairs, said predetermined number of the first column decoder units and said predetermined number of the writing means is two.

3. The semiconductor memory device of claim 1, wherein in each of said second column decoder units, the first common data line pairs are connected in common to the second common data line pair; a second switching means is connected between each of the first common data line pairs and the second common data line pair; and the second switching means is turned on or off in response to a second column decode signal applied from the outside, to connect said one of the first common data line pairs to the second common data line pair.

4. The semiconductor memory device of claim 1, wherein in each of said writing means, write switching means is connected between the data input line pair and the corresponding one of the first common data line pairs.

5. The semiconductor memory device of claim 4, wherein said write switching means is controllably turned on or off in response to a switch control signal obtained by a logical operation of a first column decode signal applied from the outside.

6. The semiconductor memory device of claim 1, wherein the number of each of said predetermined number of the first common data line pairs, said predetermined number of the first column decoder units and said predetermined number of the writing means is four.

7. The semiconductor memory device of claim 6, wherein in each of said first column decoder units, said bit line pairs are connected in common to the first common data line pairs; a first switching means is connected between said bit line pairs and the first common data line pairs; and the first switching means is turned on or off in response to a first column decode signal applied from the outside, to connect said one of a predetermined number of said bit line pairs to the first common data line pairs.

8. The semiconductor memory device of claim 6, wherein in each of said second column decoder units, the first common data line pairs are connected in common to the second common data line pair; a second switching means is connected between each of the first common data line pairs and the second common data line pair; and the second switching means is turned on or off in response to a second column decode signal applied from the outside, to connect said one of the first common data line pairs to the second common data line pair.

9. The semiconductor memory device of claim 6, wherein in each of said writing means, write switching means is connected between the data input line pair and the corresponding one of the first common data line pairs.

10. The semiconductor memory device of claim 9, wherein said write switching means is controllably turned on or off in response to a switch control signal obtained by a logical operation of a first column decode signal applied from the outside.

11. The semiconductor memory device of claim 1, wherein the number of said memory cell blocks is two or more.

12. The semiconductor memory device of claim 11, wherein in each of said second column decoder units, the first common data line pairs are connected in common to the second common data line pair; a second switching means is connected between each of the first common data line pairs and the second common data line pair; and the second switching means is turned on or off in response to a second column decode signal applied from the outside, to connect said one of the first common data line pairs to the second common data line pair.

13. The semiconductor memory device of claim 11, wherein in each of said writing means, write switching means is connected between the data input line pair and the corresponding one of the first common data line pairs.

14. The semiconductor memory device of claim 13, wherein said write switching means is controllably turned on or off in response to a switch control signal obtained by a logical operation of a first column decode signal applied from the outside.

15. The semiconductor memory device of claim 11, wherein the number of each of said predetermined number of the first common data line pairs, said predetermined number of the first column decoder units and said predetermined number of the writing means is four.

16. The semiconductor memory device of claim 15, wherein in each of said first column decoder units, said bit line pairs are connected in common to the first common data line pairs; a first switching means is connected between said bit line pairs and the first common data line pairs; and the first switching means is turned on or off in response to a first column decode signal applied from the outside, to connect said one of a predetermined number of said bit line pairs to the first common data line pairs.

17. The semiconductor memory device of claim 15, wherein in each of said second column decoder units, the first common data line pairs are connected in common to the second common data line pair; a second switching means is connected between each of the first common data line pairs and the second common data line pair; and the second switching means is turned on or off in response to a second column decode signal applied from the outside, to connect said one of the first common data line pairs to the second common data line pair.

18. The semiconductor memory device of claim 15, wherein in each of said writing means, write switching means is connected between the data input line pair and the corresponding one of the first common data line pairs.

19. The semiconductor memory device of claim 18, wherein said write switching means is controllably turned on or off in response to a switch control signal obtained by a logical operation of a first column decode signal applied from the outside.

* * * * *